United States Patent [19]

Ose et al.

[11] Patent Number: 5,089,699
[45] Date of Patent: Feb. 18, 1992

[54] SECONDARY CHARGED PARTICLE ANALYZING APPARATUS AND SECONDARY CHARGED PARTICLE EXTRACTING SECTION

[75] Inventors: Yoichi Ose; Yoshiya Higuchi, both of Hitachi; Kazuyoshi Miki, Katsuta, all of Japan

[73] Assignee: Hitachi, Ltd., Tokyo, Japan

[21] Appl. No.: 491,820

[22] Filed: Mar. 12, 1990

[30] Foreign Application Priority Data

Mar. 14, 1989 [JP] Japan ................... 1-059690

[51] Int. Cl.⁵ .............................................. H01J 37/26
[52] U.S. Cl. ...................................... 250/306; 250/307; 250/309; 250/305; 250/310
[58] Field of Search ............... 250/306, 305, 309, 288, 250/310, 307, 396 R, 396 ML, 398, 399

[56] References Cited

U.S. PATENT DOCUMENTS

| | | | |
|---|---|---|---|
| 3,840,743 | 10/1974 | Tamura et al. | 250/309 |
| 3,986,025 | 10/1976 | Fujiwara et al. | 250/306 |
| 4,107,527 | 8/1978 | Cherepin et al. | 250/309 |
| 4,737,639 | 4/1988 | Rusch | 250/305 |
| 4,740,697 | 4/1988 | Suzuki | 250/306 |
| 4,758,723 | 7/1988 | Wardell et al. | 250/305 |
| 4,785,172 | 11/1988 | Kubena et al. | 250/288 |
| 4,810,879 | 3/1989 | Walker | 250/306 |

Primary Examiner—Jack I. Berman
Assistant Examiner—Kiet T. Nguyen
Attorney, Agent, or Firm—Antonelli, Terry, Stout & Kraus

[57] ABSTRACT

In a secondary charged particle analyzing apparatus such as a secondary ion mass analyzing apparatus, a scanning type electron mass analyzer, etc., in order to obtain a high resolving power and a high sensitivity, trajectories of secondary charged particles are corrected by means of an accelerating lens formed in a secondary charged particle extracting section disposed within the apparatus.

20 Claims, 17 Drawing Sheets

F I G. 1
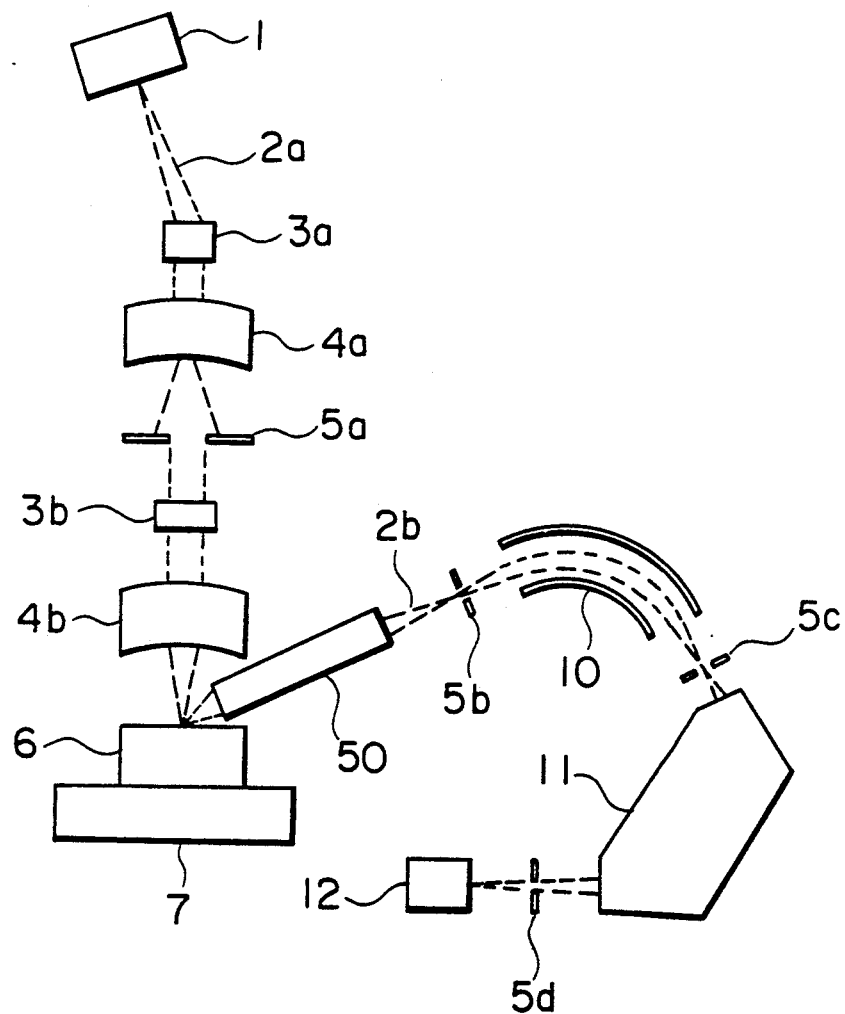

F I G. 4
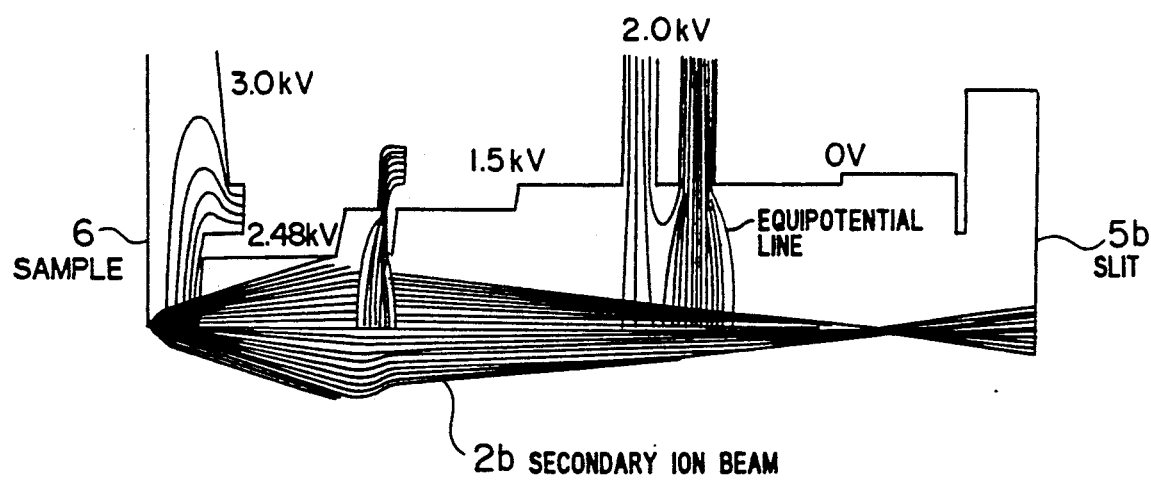

SECONDARY CHARGED PARTICLE ANALYZING APPARATUS AND SECONDARY CHARGED PARTICLE EXTRACTING SECTION

BACKGROUND OF THE INVENTION

The present invention relates to a secondary charged particle analyzing apparatus, in which secondary charged particles (secondary ions and secondary electrons) generated from an object to be examined by irradiating it with primary charged particles (primary ions and primary electrons) are focused and the secondary charged particles are analyzed.

As secondary charged particle analyzing apparatuses there are known secondary ion mass analyzing apparatuses and scanning electron microscopes.

For example, in the case where constituent elements of a semiconductor device such as an LSI, etc. are analyzed by means of a secondary ion mass analyzing apparatus, constituent elements in an irradiated domain are sputtered by irradiating the object to be examined with a primary ion beam and the mass of the secondary ions thus obtained is analyzed. However, owing to an increase in the packing density in semiconductor devices to an ultra high density by recent LSI techniques, sizes of constituent members, wiring widths in LSIs, etc., smaller than 1 µm have been realized. In addition, the concentration of impurities implanted in a semiconductor device varies by a factor greater than 6 orders of magnitude, depending on the place. In order to analyze such a fine domain with a high precision, it is necessary to narrow the domain irradiated with the primary ion beam. However, because of the space charge effect it is difficult to narrow the primary ion beam and the diameter thereof can be hardly reduced to several micrometers. Consequently, according to the prior art techniques, in the case where elements are to be analyzed for such an ultra fine domain, the selected area method is adopted, by which a domain, whose diameter is several micrometers, is irradiated with the primary ion beam and a secondary ion beam emitted by this domain is focused through a lens system (hereinbelow called a secondary charged particle extracting section) and among obtained images only images of the ultra fine domain to be examined are taken out through a slit, etc., and injected in a mass analyzing system. However, according to the simple prior art selected area method, e.g. when the mass difference is as small as for 1/4000 such as $^{31}P$ and $^{30}Si^{1}H$, the mass analysis itself is difficult and it is necessary to improve the property of the beam projected to the mass analyzing system.

SUMMARY OF THE INVENTION

However, in a prior art secondary charged particle analyzing apparatus, dispersions in the exit angle and the position of the secondary charged particle beam extracted from the secondary charged particle extracting section are great and therefore the resolving power and the sensitivity cannot be high. Further, for this reason, in particular in the secondary ion mass analyzing apparatus, the element analysis cannot be effected for an ultrafine domain.

A first object of the present invention is to provide a secondary charged particle analyzing apparatus having a high resolving power and a high sensitivity.

A second object of the present invention is to provide a secondary charged particle extracting section having small dispersions in the exit angle and the position of the secondary charged particle beam.

The objects of the present invention can be achieved by correcting the trajectory of secondary charged particles by means of an accelerating lens formed by the secondary charged particle extracting section.

An embodiment of the secondary charged particle extracting section according to the present invention is illustrated in FIG. 2. FIG. 3 shows schematically the action thereof with the structure of equivalent optical lenses. An electrostatic lens is an electric field produced between two electrodes having a potential difference. Since charged particles are subjected always to a force in the direction of the electric field, it has usually the property of a convex lens.

Secondary charged particles 30a, 30b and 30c sputtered from a sample 6 with a certain angular distribution are extracted by an electrostatic lens 31 (hereinbelow called an extracting lens) formed between the sample 6 and an extracting electrode 8 and then accelerated by an electrostatic lens 32 (electrostatic lens formed between the extracting electrode 8 and an electrode 9a, hereinbelow called an accelerating lens) to a predetermined energy. In a prior art device, since this acceleration energy is fixed, the strength of the extracting lens 1 and the strength of the accelerating lens 32 are dependent on each other and it is not possible to regulate them independently. Thus the incident angle of charged particles projected to a focusing lens 33 composed of electrodes 9a, 9b and 9c varies every time the strength of the extracting lens 31 is varied (every time the potential of the extracting electrode 8 is varied) and therefore it is not possible to make the best of the ability of the focusing lens.

In particular, when a cross-over 35b is produced, as indicated by broken lines in FIG. 3, the incident angle of projected charged particles increases. Therefore the exit angle and the dispersion to the secondary charged particle analyzing system increase. Consequently it is possible to decrease the incident angle of charged particles injected in the focusing lens 33, as indicated by full lines in FIG. 3, by correcting the trajectory of the secondary charged particles by means of the formed acceleration lens. As the result, it is possible to make the best of the ability of the focusing lens. In this way, since the exit angle and the dispersion to the secondary charged particle analyzing system are decreased, it is possible to provide a secondary charged particle analyzing apparatus having a high resolving power and a high sensitivity.

BRIEF DESCRIPTION OF THE DRAWINGS

FIG. 1 is a scheme showing the construction of a secondary ion mass analyzing apparatus, which is an embodiment of the present invention;

FIGS. 4 and 5 show numerical simulations of the electric field distribution and trajectories of secondary ion beams in the embodiment indicated in FIG. 2;

DESCRIPTION OF THE PREFERRED EMBODIMENTS

Figure 2:
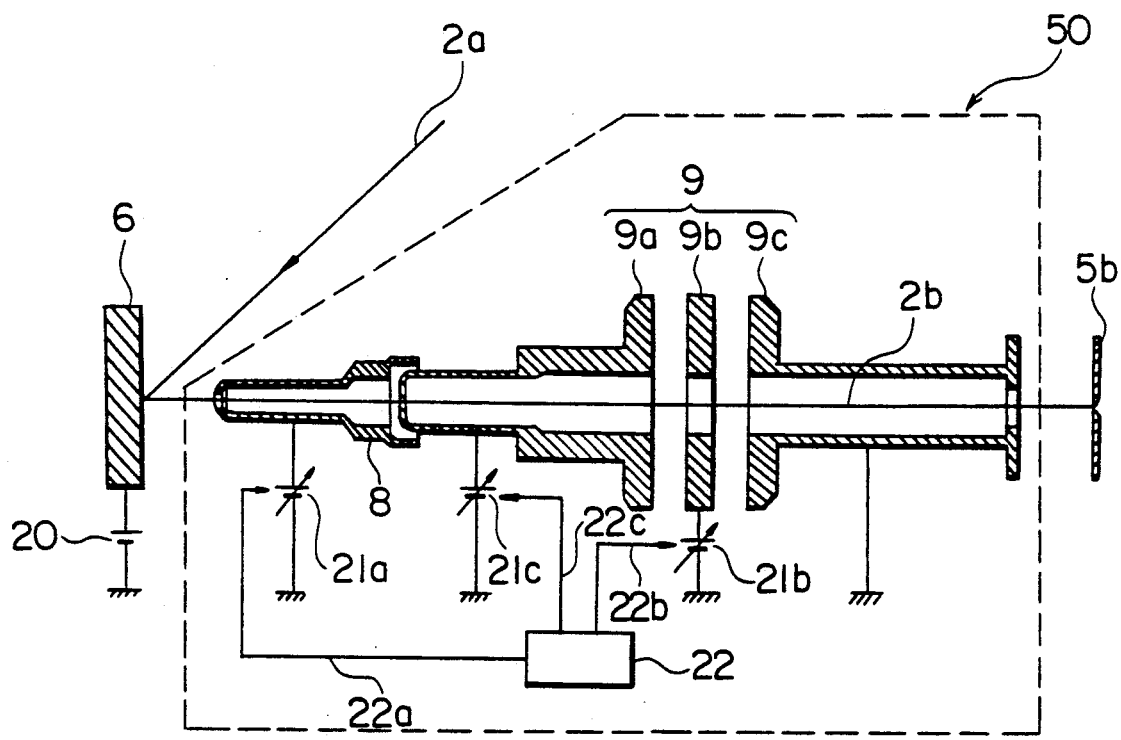
FIG. 2 is a cross-sectional view of the secondary charged particle extracting section relating to the first embodiment of the present invention.

A preferred embodiment of the present invention will be explained, taking a case, where it is applied to a secondary ion mass analyzing apparatus, as an example, referring to FIGS. 1 to 7.

FIG. 1 shows the construction of a secondary ion mass analyzing apparatus according to the present invention. In the present secondary ion mass analyzing apparatus the unnecessary ion component in an ion beam $2a$ emitted by a primary ion source 1 is removed by an electrode $3a$. This ion beam is focused by electrostatic lenses $4a$ and $4b$ in the primary ion irradiation system as well as a slit $5a$ so as to have a diameter of several micrometers and projected on a sample 6 while scanning a region of several hundred micronmeters square by means of a deflecting lens $3b$. Secondary ions sputtered by these primary ions are imaged on a slit $5b$ serving as the exit aperture to the following mass analyzing system by the secondary charged particle extracting apparatus 50. Only the secondary ions, which have passed through the slit $5b$, whose diameter is varied, in order to select the secondary ions in a desired domain, can enter a detector 12 through a sector type electric field 10, a sector type magnetic field 11 as well as slits $5c$ and $5d$ to be mass-analyzed there. A sample driving section 7 moves the sample left and right and forward and backward or tilts it, in order to determine the position where the analysis is to be effected, or to change irradiation conditions.

Figure 3:
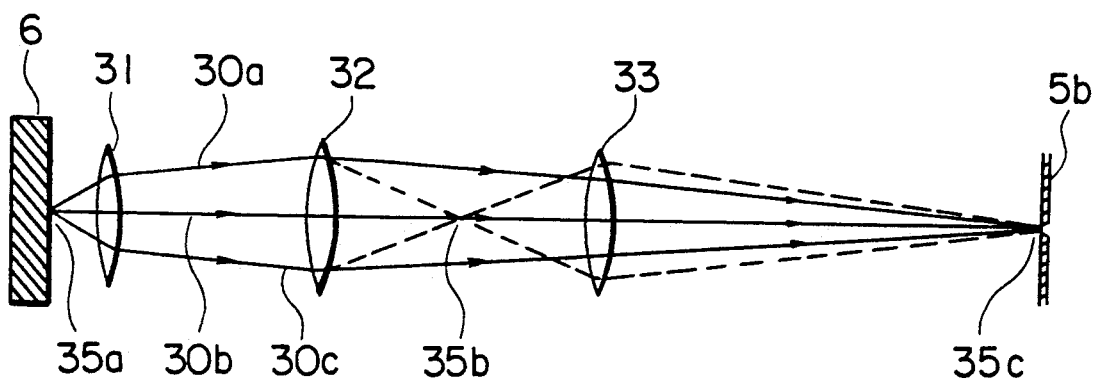
FIG. 3 is a scheme representing the secondary charged particle extracting section indicated in FIG. 2 with optical lenses.

FIG. 2 shows the construction of the secondary charged particle extracting section 50 indicated in FIG. 1, and FIG. 3 is a scheme illustrating the action of the secondary charged particle extracting section 50 indicated in FIG. 2 by using optical lens structure. The secondary charged particle extracting apparatus 50 relating to the present embodiment consists of an extracting electrode 8 connected with a variable voltage power supply $21a$; an Einzel lens 9 serving as a focusing lens, provided with three electrodes $9a$, $9b$ and $9c$; a variable voltage power supply $21c$ connected the electrode $9a$ disposed directly after the extracting electrode 8; a variable voltage power supply $21b$ connected with the central electrode $9b$; and control means 22 for controlling these variable voltage power supplies $21a$, $21b$ and $21c$. The electrode $9c$ is connected with the ground in the present embodiment.

When the sample 6 is irradiated with the primary ion beam $2a$ focused by the primary irradiating system so as to have a diameter of several micrometers, the secondary ions sputtered from this sample 6 are extracted towards the extracting electrode 8 by the extracting lens 31 formed between the extracting electrode 8 and the sample 6. The secondary ions extracted by the extracting electrode 8 are accelerated by the electrostatic lens 32 formed between the electrodes 8 and are $9a$ and focused by the focusing lens consisting of the electrostatic lens 33 formed between the electrodes $9a$ and $9b$ and the electrostatic lens formed between the electrodes $9b$ and $9c$ on the slit $5b$. A voltage corresponding to the acceleration energy of the secondary ion beam $2b$ is applied to the sample 6 by a power supply 20. The control means 22 regulates the potential of each of the electrodes 8, $9a$ and $9b$ so that the secondary ion beam $2b$ is focused on the slit $5b$, as follows.

FIG. 4 shows the numerical simulation result in the present embodiment.

Figure 5:
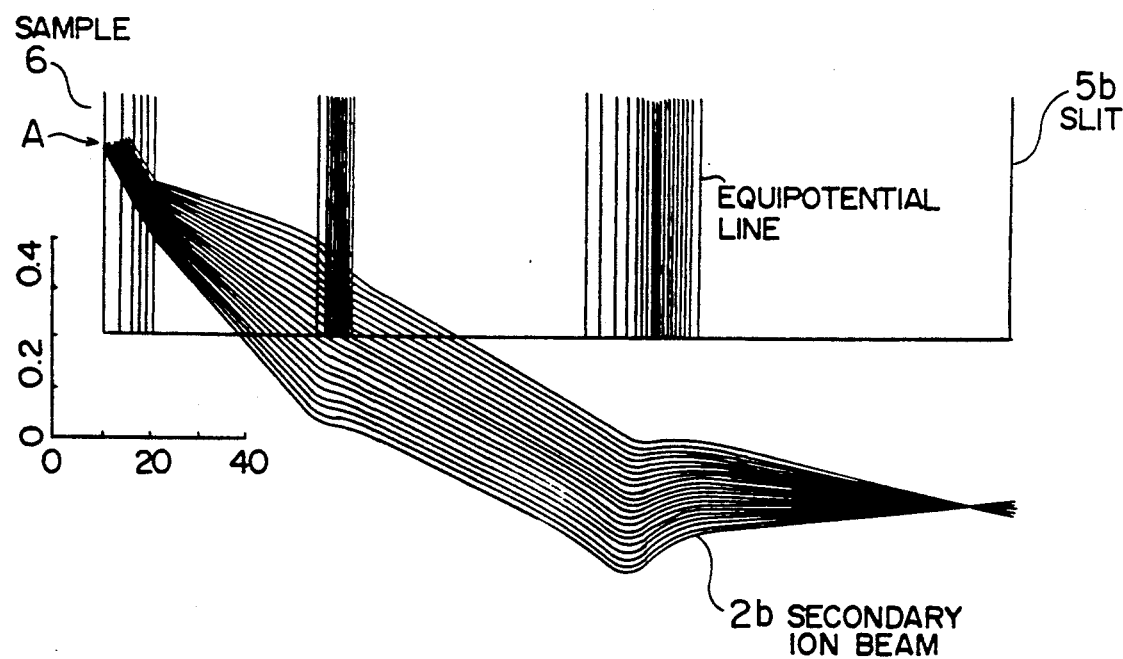

FIG. 5 shows a simulation result of trajectories of secondary ions sputtered from the sample 6 in an angular region within ±1° measured from the normal direction, in which the scale in the ordinate direction is multiplied by 100. This figure shows trajectories, which secondary ions emitted by an extremely small region A trace, in which the scale perpendicular to the center line of the beam is enlarged, and corresponds to a scheme, in which two of the trajectories representing secondary ions indicated in FIG. 4 are enlarged. A voltage of 3.0 kV is applied to the sample 6 by the power supply 20; a voltage of 2.48 kV is applied to the extracting electrode 8 by the variable voltage power supply $21a$; a voltage of 1.5 kV is applied to the electrode $9a$ by the variable voltage power supply $21c$; and a voltage of 2.0 kV is applied to the electrode $9b$ by the variable voltage power supply $21b$.

Figure 6:
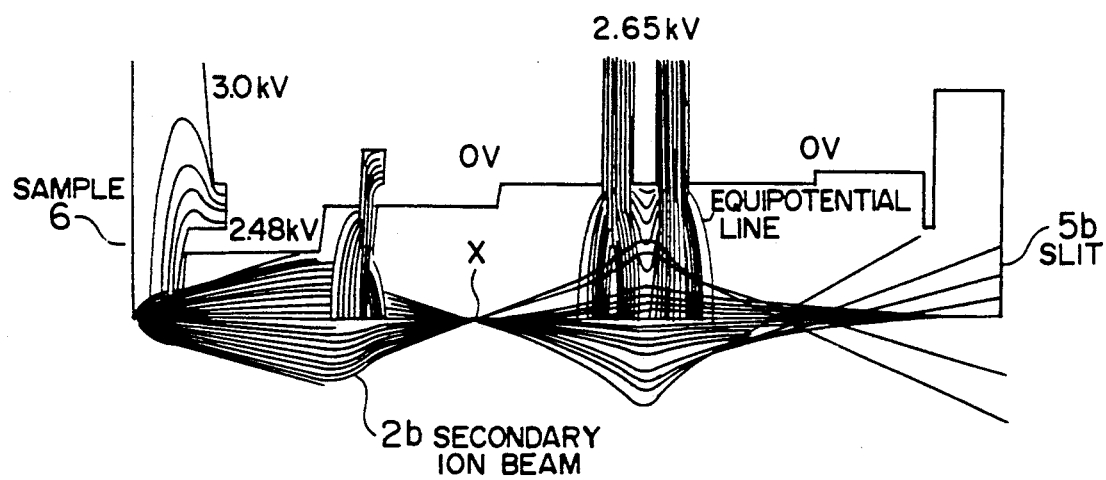
FIGS. 6 and 7 show numerical simulations of the electric field distribution and trajectories of secondary ion beams in a prior art secondary charged particle extracting section.
Figure 7:
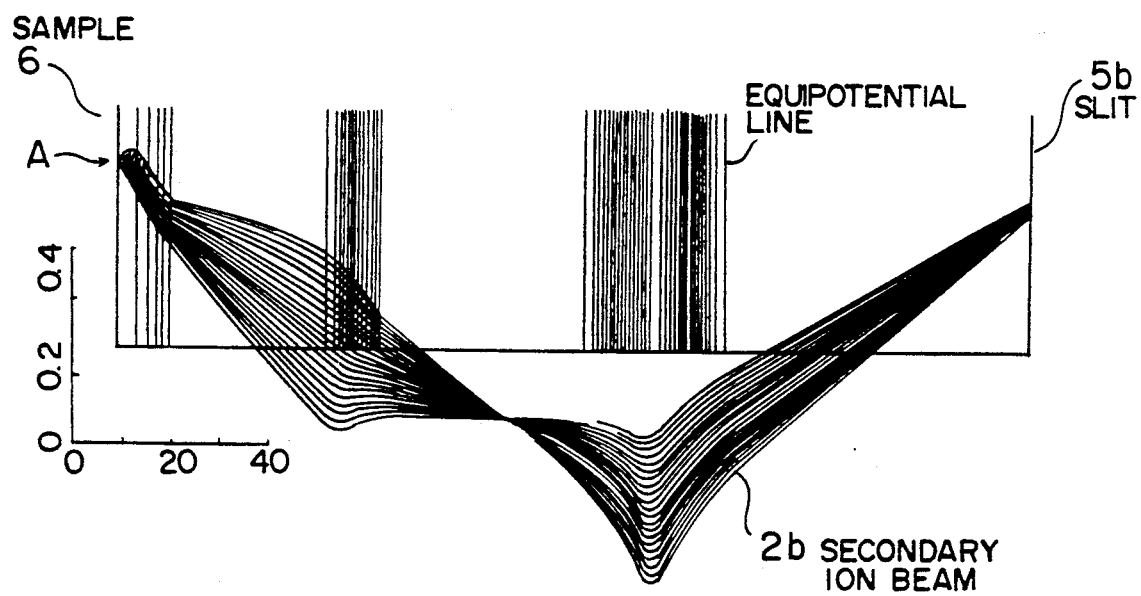

On the other hand, FIGS. 6 and 7 are schemes corresponding to FIGS. 4 and 5, respectively, in a prior art example, in which the electrode $9a$ constituting the focusing lens indicated in FIG. 2 is connected with the ground. At this time the secondary ion accelerating voltage (voltage of the power supply 20) is 3.0 kV; the voltage applied to the extracting electrode 8 is 2.48 kV; and the voltage applied to the central electrode $9b$ of the Einzel lens 9 focusing the secondary ion beam $2b$ is 2.65 kV. In this case the potential difference between the sample 6 and the extracting electrode 8 is as small as 0.52 kV and on the contrary the potential difference between the extracting electrode 8 and the electrode $9a$ is as great as 2.48 kV. Consequently, as the trajectories are indicated in FIG. 6, the secondary ion beam forms a cross-over point (focusing point) X within the electrode $9a$, i.e. between the accelerating lens 32 and the focusing lens 33. For this reason the incident angles to the focusing lenses between the electrodes $9a$ and $9b$ as well as between the electrodes 9b and 9c are great and the voltage applied to the central electrode 9b should be increased, in order to focus this secondary ion beam. Further, as it can be seen from FIG. 7, a secondary ion beam 2b emerging above the central axis is focused once at a point under the central axis, again diverged, and focused at a point above the central axis. That is, under a condition that a normally standing image is formed at the slit 5b, the incident angle of the secondary ion beam is too great and therefore the efficiency of the mass analyzing system located behind the slit 5b is worsened. That is, in a prior art secondary charged particle extracting device, since a converging lens having a great converging factor should be used, the exit angle of secondary charged particles to the mass analyzing system and the positional divergence thereof are great, as indicated in FIG. 6. This problem cannot be solved however well the voltage applied to the central electrode 9b is regulated.

On the other hand, in the present invention, contrarily to the fact that 3.0 kV and 2.48 kV are applied to the sample 6 and the extracting electrode, respectively just as in the prior art example, 1.5 kV and 2.0 kV are applied to the electrodes 9a and 9b, respectively by regulating the variable voltage power supplies 21c and 21b. In the present embodiment, since the potential of the electrode 9a is set at 1.5 kV to decrease the potential difference between this potential and that of the extracting electrode 8, i.e. since the focal length of the accelerating lens is great, no focusing point X is formed between the accelerating lens 32 and the focusing lens 33, adjacent secondary ion beams passing through the electrode 9a are approximately parallel to each other. Therefore the incident angle to the focusing lens is small for all the secondary ion beams and thus it is possible to focus them satisfactorily on the slit 5b by means of a weak focusing lens (the voltage applied to the electrode 9b is low). Consequently the aberration is small. Therefore, as indicated in FIG. 5, the secondary ion beam 2b produced at the extremely small region A above the central axis is transformed into an approximately parallel beam by the accelerating lens 32 and focused below the central axis by the focusing lens 33. The incident angle of the secondary ion beam to the slit 5b located at this position in order to catch secondary ions emitted from the extremely small region A is close to a right angle and the trajectory thereof is perpendicular thereto. Consequently the incident angle of the secondary ion beam 2b as a whole is also close to a right angle and the trajectory thereof is perpendicular thereto. It is possible to obtain results of the analysis with a high resolving power and a high sensitivity by taking in the secondary ions in this focused portion in the mass analyzing system to analyze them.

In order to trace the electric field distribution as described above, i.e. the trajectory of the secondary ion beam, the potentials of the variable voltage power supplies 21a to 21c are adjusted by means of the control means 22. At first, the control means 22 sends the control signal 22a to the power supply 21a to set the conditions for extracting the secondary ions. Then it sends the control signals 22c and 22b to the power supplies 21c and 21b, respectively, using this control signal 22a as a parameter to determine the potentials of the electrodes 9a and 9b. Next the control signal 22c is sent to the power supply 21c in order to regulate finely the potential of the electrode 9a. Finally the potential of the electrode 9b is determined by regulating finely the power supply 21b. The exit angle of the secondary ion beam is regulated by this control of the power supply 21c. That is, the exit angle to the focusing lens is regulated in this way. Further the focal length is regulated by means of the power supply 21b. The voltages of the power supplies are determined while regulating finely both the variable power supplies 21b and 21c after having determined the extracting conditions. However, in practice, a test pattern is located at the position of the sample 6 and the voltages of the power supplies are regulated while observing the image of the secondary ion beam by means of a detector or a monitor located at the position of the slit 5b. In addition, it is possible also to dispose an auto focus device in the monitor so as to regulate the control means 22 by using a feedback signal from this device.

Figure 8:
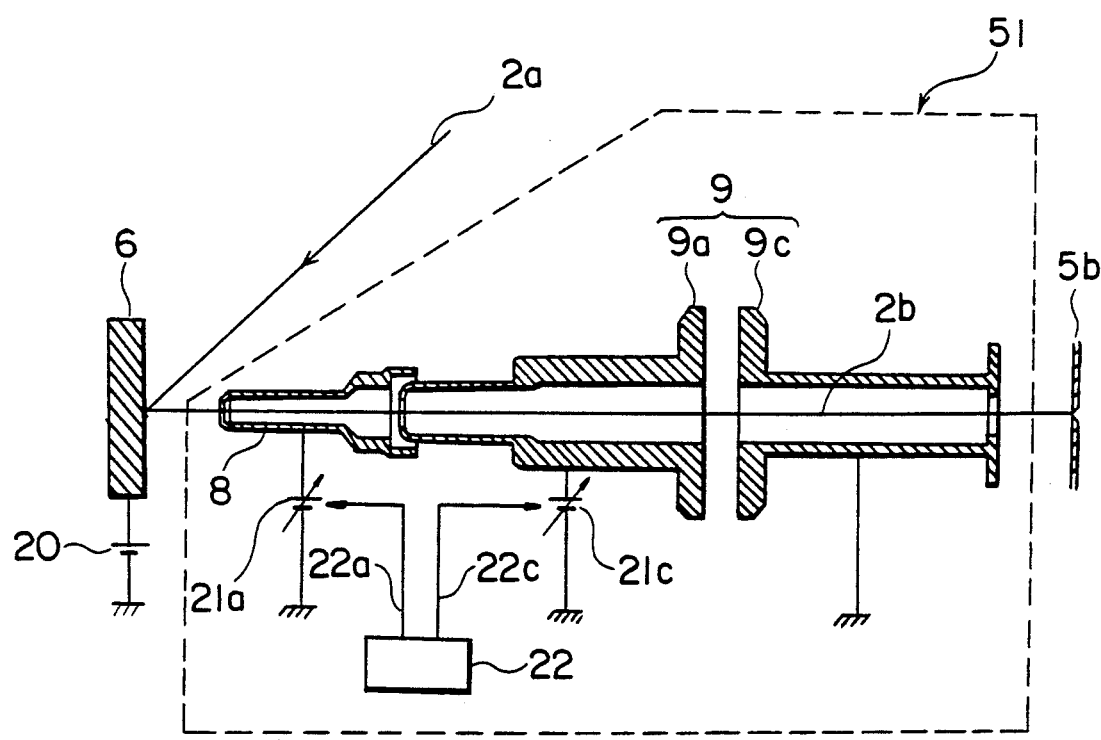
FIG. 8 is a cross-sectional view of the secondary charged particle extracting section relating to a second embodiment of the present invention.

FIG. 8 is a scheme showing the construction of the second embodiment of the secondary charged particle extracting device. A secondary charged particle extracting device 51 relating to the present embodiment differs from the secondary charged particle extracting device 50 described in the first embodiment only in not including the electrode 9b and the variable voltage power supply 21b. The present embodiment is suitable, in the case where the control domain of the voltage applied to the extracting electrode 8 is restricted to a predetermined domain. In this case, it is possible to focus secondary charged particles on the slit 5b only by regulating the voltage applied to the electrode 9a. In particular, since the intensity of the accelerating lens formed between the extracting electrode 8 and the electrode 9a and that of the focusing lens between the electrode 9a and the electrode 9c can be adjusted by regulating the voltage of the electrode 9a, an advantage is obtained that it has a higher sensitivity and can be regulated in a simpler manner than that described in the first embodiment.

Figure 9:
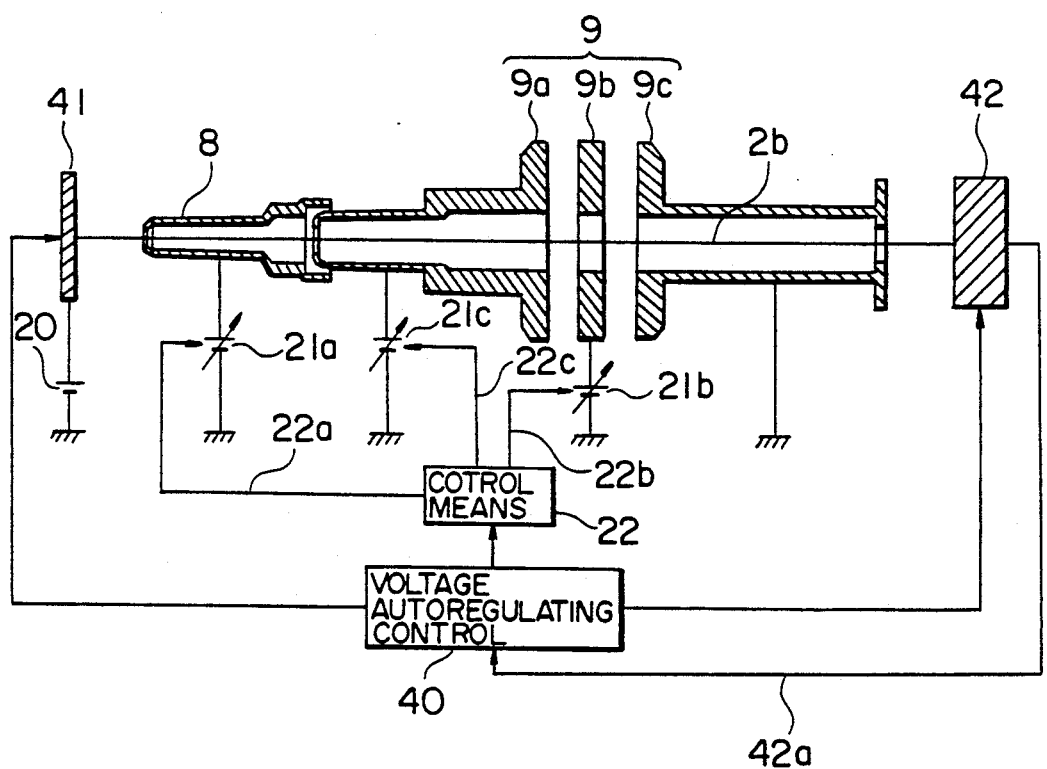
FIG. 9 is a cross-sectional view of the secondary charged particle extracting section relating to a third embodiment of the present invention.

FIG. 9 is a scheme illustrating the construction of the third embodiment of the secondary charged particle extracting section according to the present invention. The secondary charged particle extracting section relating to the present embodiment differs from that described in the first embodiment only in that voltage autoregulating means 40 is added thereto. The present embodiment is so constructed that, at the voltage regulation for obtaining the optimum voltage condition, a finely movable radiation source 41 generating a particle beam including $\alpha$-ray or $\beta$-ray having a diameter of several micrometers is located at the position of the sample so that the particle beam from this radiation source 41 is injected through the extracting electrode 8 and so that the particle beam is focused on a wire detector (in which the interval between wires is adjustable) 42 disposed at the position of the slit.

At first, parameters are set previously in the control means 22 so that the voltages of the power supplies 21b and 21c are determined unambiguously according to a certain predetermined function by determining the voltage of the extracting electrode 8. Then, the radiation source 41 is located at the position of the sample and the particle beam is extracted through the extracting electrode 8 so that it is focused on the wire detector 42. The wire detector 42 measures the electric current or counts the number of pulses. At this measurement the position of two wires stretched in a direction perpendicular to the particle beam is regulated and the position, where the electric current or the number of pulses is maximum, is obtained. Next, the wires are fixed at this position; the voltages applied to the electrodes 9a and 9b are finely regulated; and the condition, under which the electric current or the number of pulses is maximum, is examined. The condition thus obtained is the optimum condition which is stored in a memory within the voltage autoregulation control means 40.

Now, in the case where the measurement is effected by using the true sample located at the position of the radiation source 41 and the slit located at the position of the wire detector 42, the variable voltage power supplies 21b and 21c are regulated and the voltage is controlled with a high precision while correcting the parameters set in the control means 22 by using information stored in the memory within the voltage autoregulation control means 40.

According to the present embodiment, the voltages applied to the electrodes can be automatically regulated so that the dispersions in the incident angle and the position of the secondary ion beam injected in the mass analyzing system are decreased.

Figure 10:
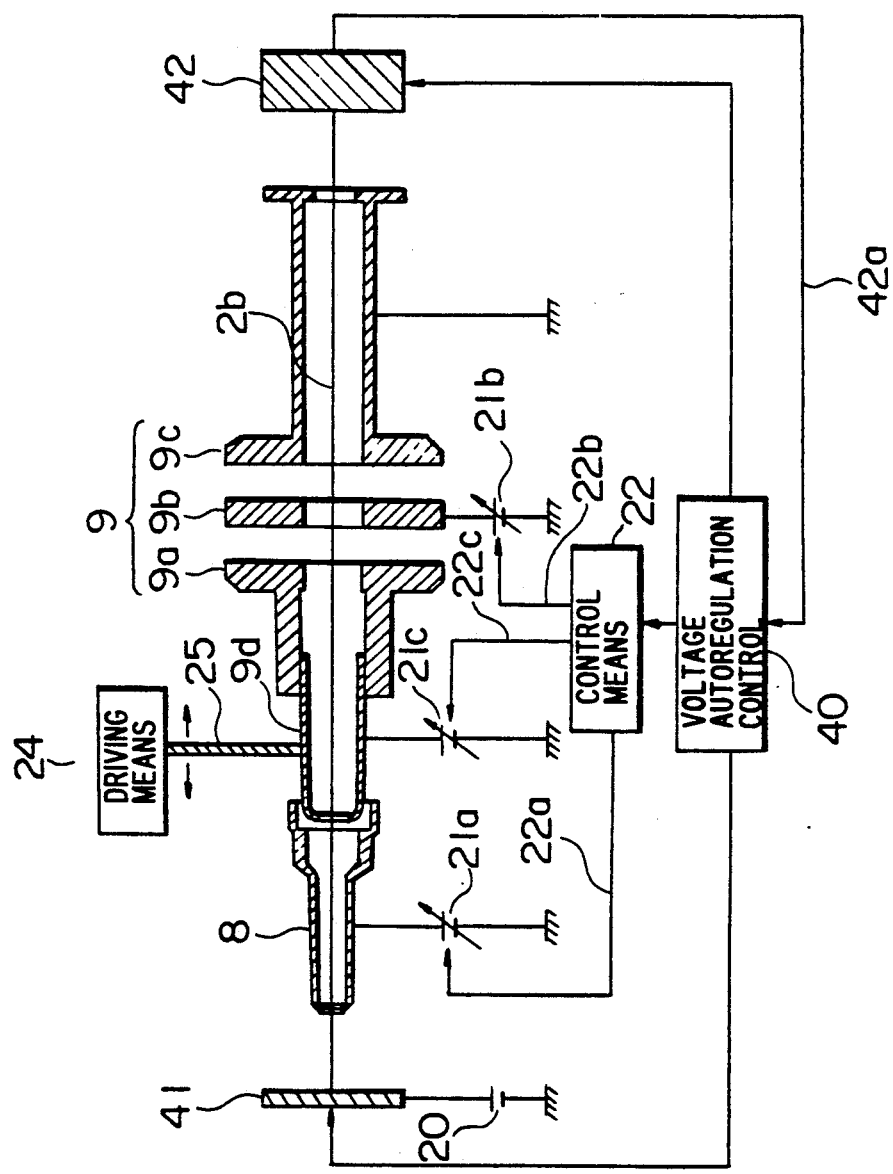
FIG. 10 is a cross-sectional view of the secondary charged particle extracting section relating to a fourth embodiment of the present invention.

Although, in each of the embodiments described above, the exit angle of the secondary ion beam is regulated by varying the voltage applied to the electrode 9a disposed directly behind the extracting electrode 8, it is possible also to dispose a mechanism regulating mechanically the position of the electrode 9a with respect to the extracting electrode 8 (distance between the two electrodes 8 and 9a) to adjust the exit angle. FIG. 10 is a scheme illustrating the construction of a secondary charged particle extracting section, which is the fourth embodiment of the present invention, based on this point of view. The present embodiment differs from the third embodiment (FIG. 9) in that a part of the electrode 9a face to the extracting electrode 8 is separated therefrom to form a movable electrode 9d and that driving means 24 regulating mechanically the distance between the two electrodes 8 and 9d via a member 25 is disposed to regulate the exit angle. That is, the potential distribution around the two electrodes is varied so that the focal length of the accelerating lens can be variable by varying the distance between the extracting electrode 8 and the electrode 9a. If this focal length is regulated in the same manner just as in the second embodiment, an effect similar to the preceding embodiments can be obtained. Further, although, in the present embodiment, it is the electrode 9a that is moved, it is possible also to move only the electrode 8 or both the two electrodes 8 and 9a.

Figure 11:
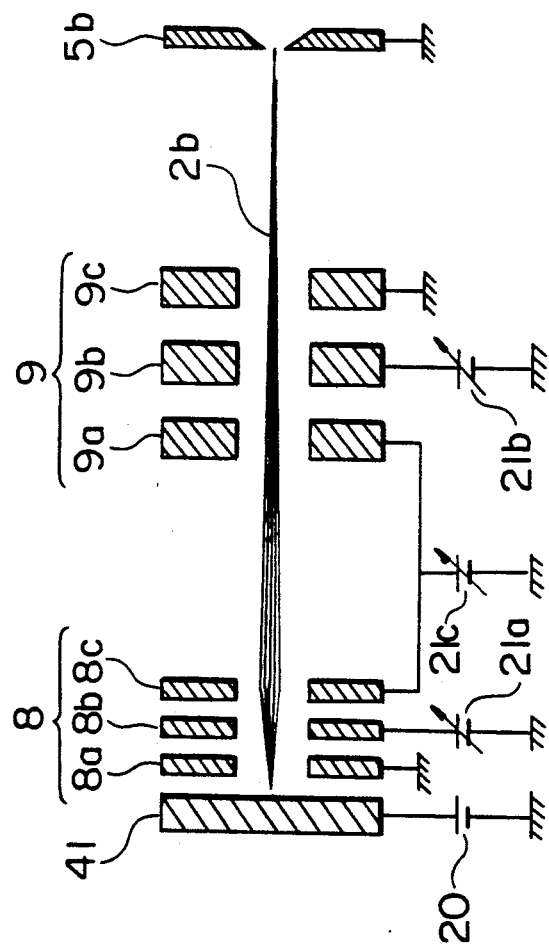
FIG. 11 is a cross-sectional view of the secondary charged particle extracting section relating to a fifth embodiment of the present invention.

FIG. 11 is a scheme illustrating another secondary charged particle extracting section, which is the fifth embodiment of the present invention. The present embodiment is an example, in which the present invention is applied to a secondary charged particle extracting section composed of two Einzel lenses 8 and 9. The Einzel lens 8 in the preceding stage constitutes the extracting electrode. The secondary ion beam is extracted and accelerated by grounding the electrode 8a in the extracting electrode, which is opposite to the sample 6. The electrodes 8b and 8c are connected with the variable voltage power supplies 21a and 21c, respectively, to regulate the incident angle of the secondary ion beam injected in the focusing lens 9. By the focusing lens 9, the secondary ion beam is focused on the slit 5b by controlling the voltage applied to the electrode 9b. It is possible to deaccelerate the secondary ion beam emerging from the electrode 8c, i.e. to increase the focal length, particularly by equalizing the voltages applied to the electrodes 8c and 9a and also to regulate the incident angle to the focusing lens 9 so as to obtain a parallel beam by regulating these voltages. For this reason it is possible to project the secondary ion beam to the slit nearly perpendicularly after the passage through the focusing lens 9. Although, in the present embodiment, three variable voltage power supplies 21a, 21b and 21c are used, the number of variable voltage power supplies can be reduced to 2, because nearly equivalent focusing characteristics can be obtained, even if the electrodes 8b and 8c are kept at a same potential or the electrodes 9a and 9b are kept at a same potential.

Figure 12:
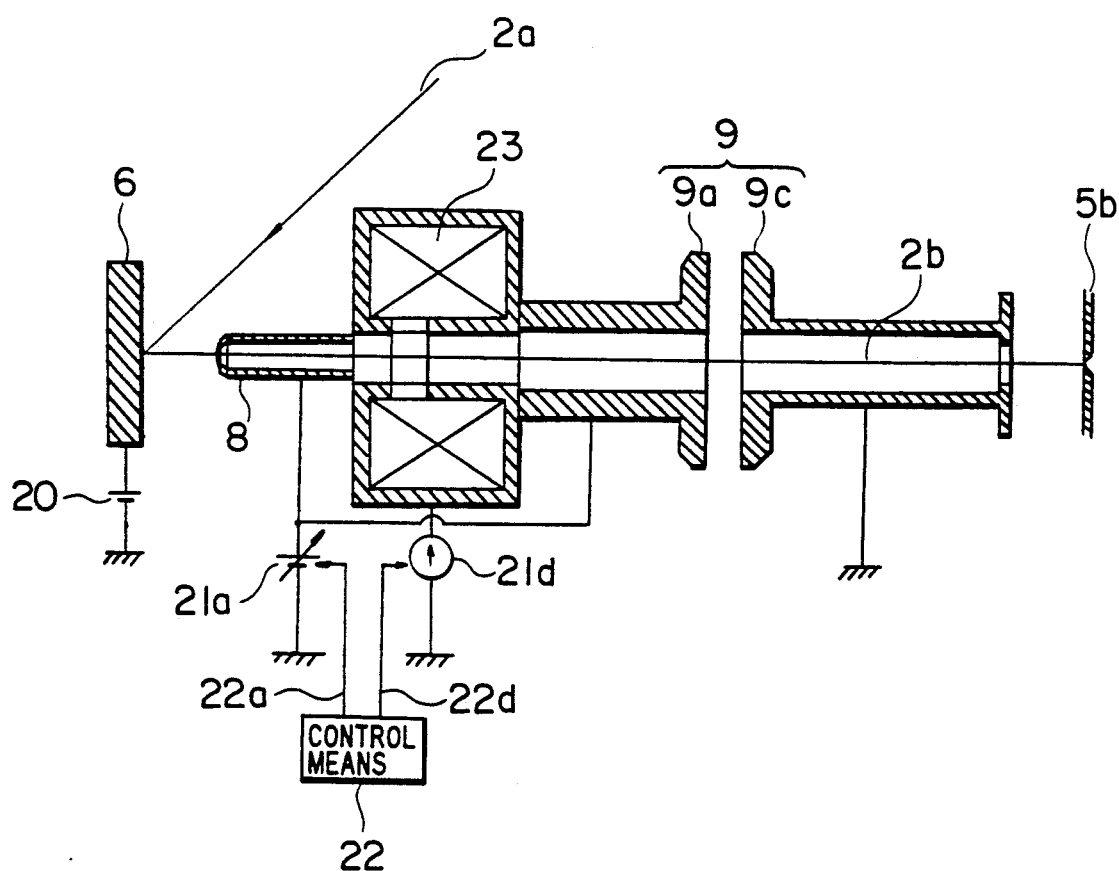
FIG. 12 is a cross-sectional view of the secondary charged particle extracting section using an electromagnetic lens, relating to a sixth embodiment of the present invention.

FIG. 12 is a scheme illustrating the construction of a secondary charged particle extracting section, which is the sixth embodiment of the present invention. The secondary charged particle extracting section in the present embodiment differs from the preceding embodiments in that an electromagnetic lens 23 is disposed between the extracting electrode 8 and the electrode 9a and that the electric current flowing through this electromagnetic lens 23 is made variable by disposing a variable current power supply 21d varying the focal length thereof. That is, contrarily to the fact that an accelerating lens having a variable focal distance is formed between the extracting electrode 8 and the electrode 9a in the first to the fifth embodiment, in the present embodiment a similar effect can be obtained by disposing an electromagnetic lens 23 having a variable focal length instead of the accelerating lens having the variable focal length. In the case where the electromagnetic lens is disposed, it is necessary to shield magnetically this electromagnetic lens 23, e.g. by using a superconductive substance, etc., so that the magnetic field has no bad influences on other measuring systems. Further, although, in the present embodiment, the extracting electrode 8 and the electrode 9a are connected with the common variable voltage power supply 21a so that they are at a same potential, it is a matter of course that they can be connected with different variable voltage power supplies so that they are at different potentials.

In the above embodiments the present invention has been described with a view to the fact that the secondary ion beam is projected to the slit 5b almost perpendicularly thereto. In the following, several embodiments will be described, in which the resolving power and the sensitivity are increased by varying the magnitude of the image, i.e. the magnification factor.

Figure 13:
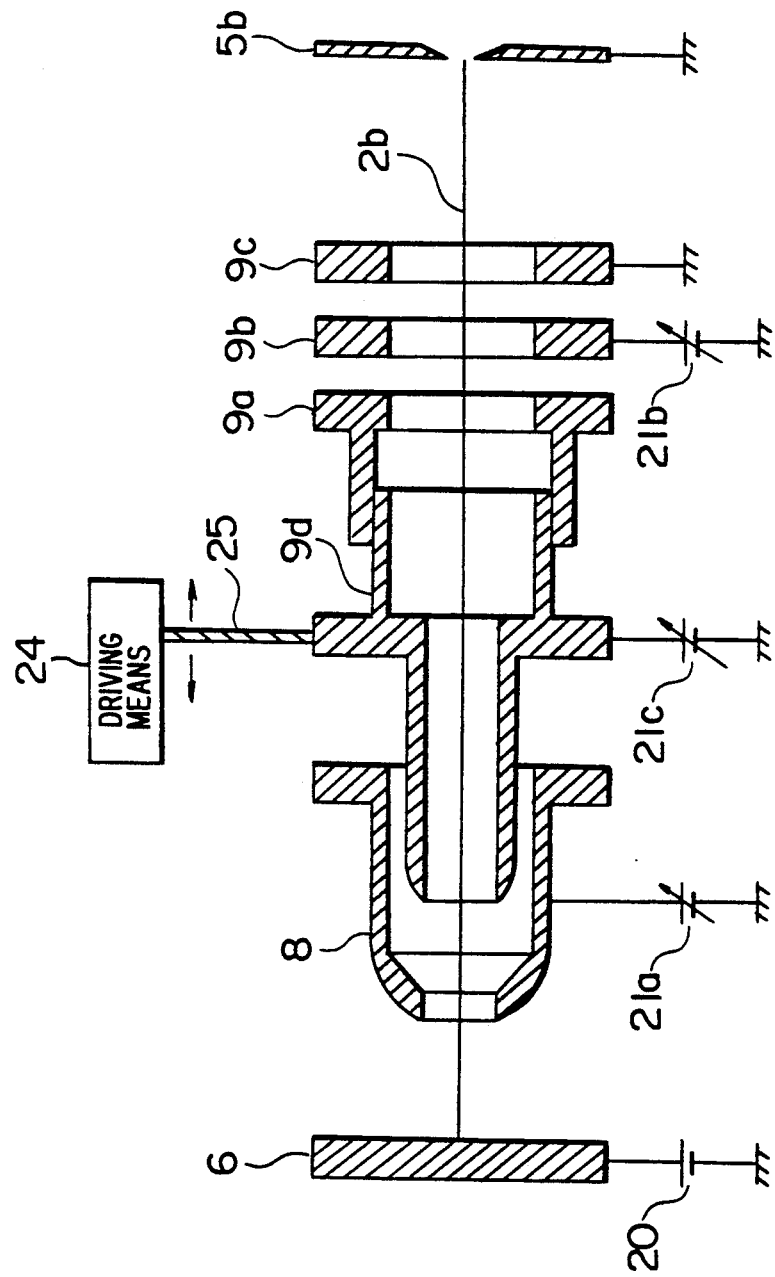
FIG. 13 is a cross-sectional view of the secondary charged particle extracting section, in which the position of the accelerating lens can be varied, relating to a seventh embodiment of the present invention.

FIG. 13 is a scheme illustrating the construction of the secondary charged particle extracting section in the seventh embodiment of the present invention from this point of view. The present embodiment is similar to the fourth embodiment. In the fourth embodiment, principally the focal length is varied almost without varying the position of the accelerating lens 32, by moving a movable focusing electrode 9d towards or away from the end portion of the extracting electrode 8. That is, since the location, where the potential distribution is dense, is between the end portion of the extracting electrode and the variable focusing electrode, the focal length is varied by varying the domain where the potential distribution is dense, i.e. the width of the lens, by controlling the position of the variable focusing electrode 9d. On the other hand, in the present embodiment the position of the accelerating lens 32 is varied by inserting the movable focusing electrode 9d in a cylindrical extracting electrode 8. If the extracting electrode 8 and the movable focusing electrode 9d are made in the form of a double cylinder, as indicated in FIG. 13, since the location where the potential distribution is dense is at the extremity of the movable focusing electrode 9d, the position of the accelerating lens 32 is varied by varying the position of the movable focusing electrode 9d.

Figure 14:
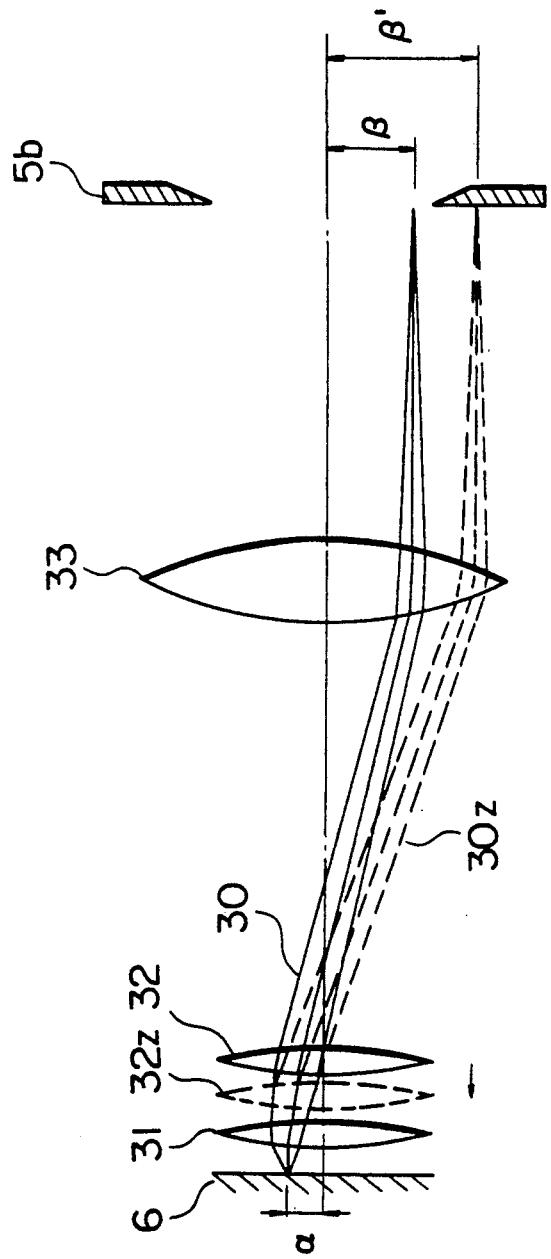
FIG. 14 shows schematically the working principle of the seventh embodiment.

FIG. 14 represents schematically the working principle of the embodiment described above. The secondary ion beam emitted from the sample 6 and extracted by the extracting lens 31 is deflected by the accelerating lens 32 and the deflection angle is varied, depending on the position of the accelerating lens 32. For example, if the accelerating lens is made closer to the sample 6 as indicated by 32z, the deflection angle increases as indicated by broken lines. Further, since the position of the injection to the focusing lens 33 becomes farther from the central axis, the image on the slit 5b becomes greater and the magnification factor increases. When the magnification factor is great, it is possible to intend to increase the positional resolving power, i.e. to realize a high resolution, by varying the width of the slit 5b. When the resolving power is increased, even if the region of very low concentration of impurities to be examined is adjacent to the region of high concentration of impurities, noise due to the region of high concentration of impurities disappears and it is possible to increase the sensitivity.

Although only the focusing electrode 9d is movable in the above embodiment, a similar effect can be obtained also, if the extracting electrode 8 and the focusing electrode 9d are movable as a whole. However, in this case, since the intensity of the extracting lens 31 composed of the sample 6 and the extracting electrode 8 is varied, it is necessary to control the voltage applied to the sample, linked with the movement of the movable part.

Figure 15:
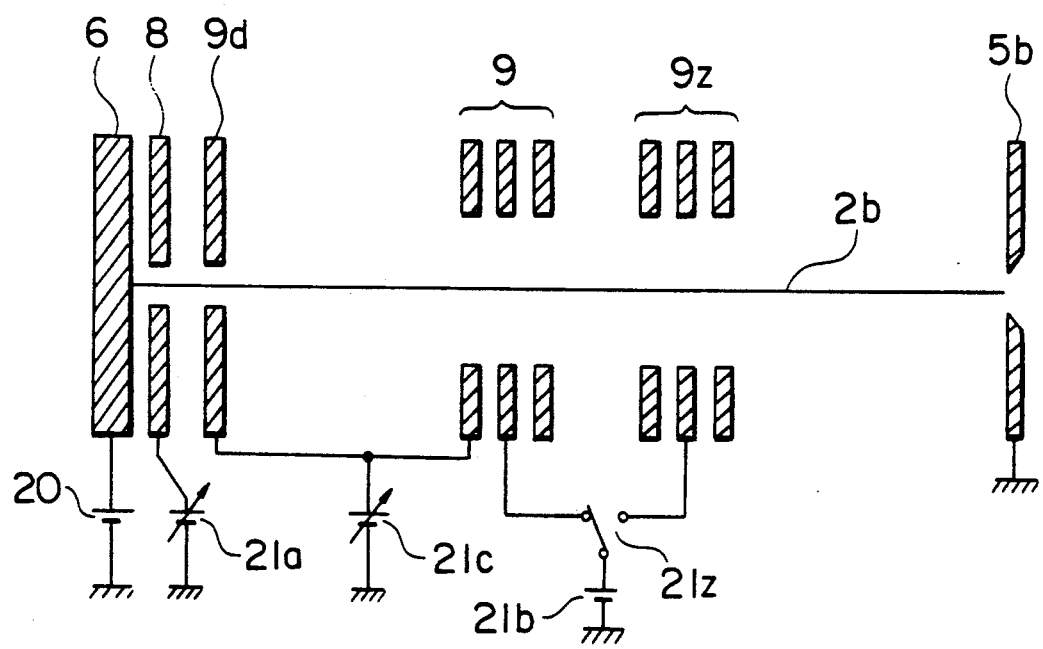
FIG. 15 is a cross-sectional view of the secondary charged particle extracting section, in which the position of the focusing lens can be varied to vary the magnification factor, relating to an eighth embodiment of the present invention.

FIG. 15 shows the eighth embodiment, in which the magnification factor is varied by varying the position of the focusing lens 9, differing from the seventh embodiment, in which the magnification factor is varied by moving the accelerating lens 32. In the present embodiment two sets of focusing lenses 9 and 9z are disposed. In this way it is possible to change the size of the image of the secondary ion beam on the slit 5b by switching over the working focusing lens 9 or 9z by means of a switch 21z.

Figure 16:
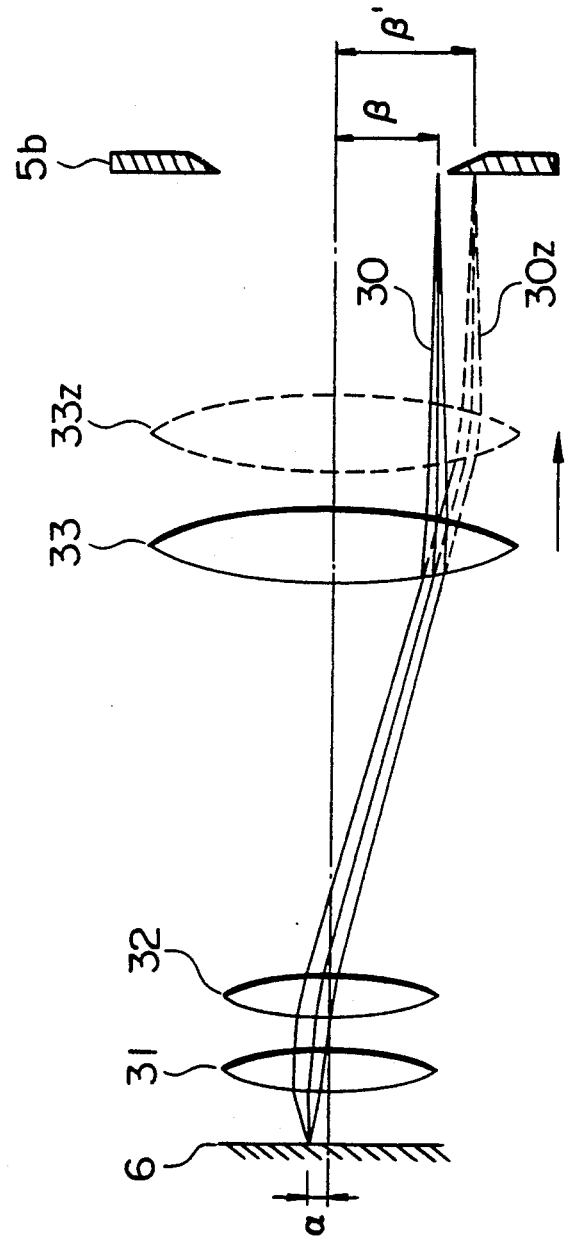
FIG. 16 shows schematically the working principle of the eighth embodiment.

FIG. 16 shows schematically the working principle of the above embodiment. A secondary ion beam emerging from the sample 6 with a size of the emerging image of $\alpha$ becomes almost parallel after the passage through the extracting lens 31 and the accelerating lens 32 (i.e. under the condition that the focusing point is on the right side of the slit 5b) and then it is injected in the focusing lens 33. The secondary ion beam 30 is focused by the focusing lens 33 so that it is injected nearly perpendicularly on the slit 5b. The size of the image is $\beta$ and the magnification factor the lens as a whole is $\beta/\alpha$. When the focusing lens is displaced to the focusing lens 33z indicated by a broken line by injecting almost parallelly the secondary ion beam 30 emerging from one point on the sample in the focusing lens 33, the size of the image is $\beta'$ and the magnification factor of the lens is $\beta'/\alpha$. In this way the magnification factor can be variable. Although the focusing lenses were switched over in the above example, the magnification factor may be continuously varied by making the position of the focusing lens 9 variable.

In the seventh and eighth embodiments, although the magnification factor was made variable and the secondary charged particle beams were injected almost parallelly each other in the focusing lens, it is a matter of course that even by using only the means for making the magnification factor variable at least the first and the second object of the present invention can be achieved.

Although the secondary ion mass analyzing apparatus was described in the above embodiments, a scanning type electron microscope having a high resolving power and a high sensitivity can be obtained by providing the scanning type electron microscope with the secondary charged particle extracting section.

Figure 17:
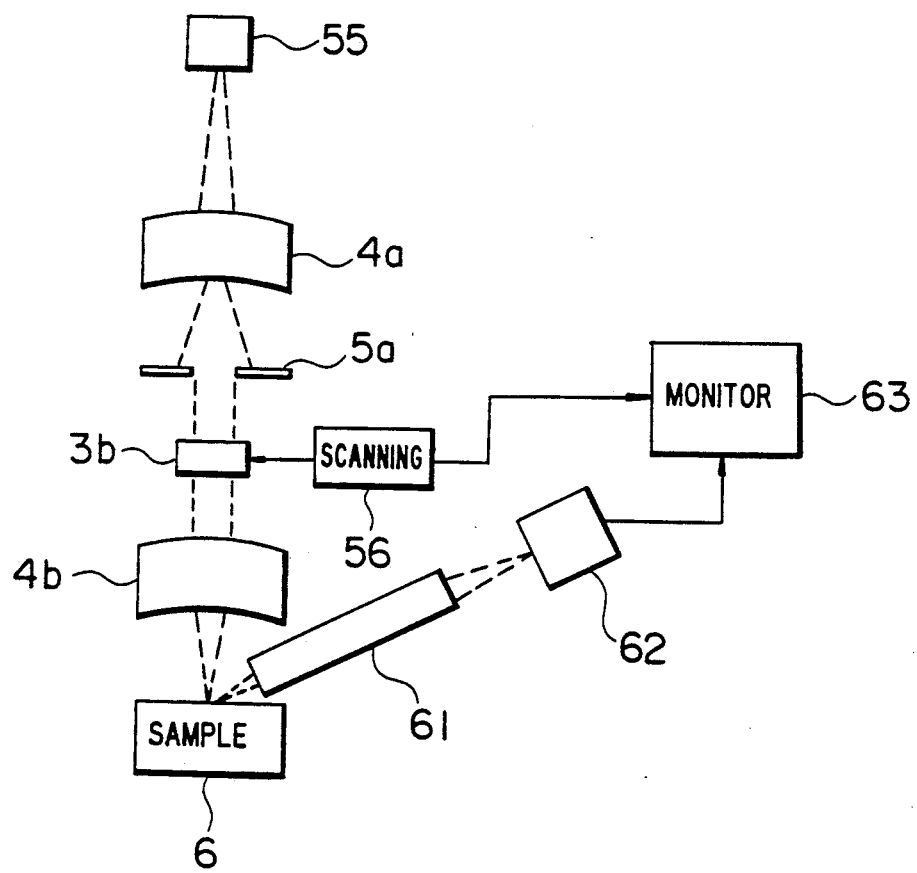
FIG. 17 is a scheme showing an embodiment, in which the present invention is applied to a scanning type electron microscope.

FIG. 17 is a scheme indicating the construction of this scanning type electron microscope. The electron beam emitted by an electron gun 55 is made narrower by the lenses 4a and 4b as well as the slit 5a of the irradiating system and the sample 6 is irradiated therewith. At this time the sample 6 is scanned with the electron beam by means of the deflecting electrode 3b driven by a scanning signal coming from a scanning power supply. Secondary electrons emitted from the sample 6 are imaged on the detecting plane of a detector 62 by a secondary electron extracting device 61. A monitoring device 63 can display the image with a high resolving power and a high sensitivity by displaying the detection signal obtained by the detector 62 while scanning it with a scanning signal from the scanning power supply 56.

As explained above, according to the present invention, it is possible to obtain a secondary charged particle analyzing apparatus having a high resolving power and a high sensitivity. Further a secondary charged particle extracting section having small dispersions in the emerging angle and the position of the secondary charged particle beam can be provided. Still further, since it is not necessary to increase so much the focusing degree of the focusing lens, it is not necessary to apply any extremely high voltage to the electrodes and it is possible to intend to prevent discharge accidents.

We claim:

1. A secondary charged particle analyzing apparatus comprising:
   a primary charged particle generating source;
   means for irradiating an object to be examined with primary charged particles emitted by said primary charged particle generating source;
   a secondary charged particle extracting section which corrects trajectories of secondary charged particles emitted from said object to be examined by means of an accelerating lens formed therein and focuses said secondary charged particles; and
   means for analyzing said secondary charged particles thus focused.

2. A secondary charged particle analyzing apparatus according to claim 1, wherein the secondary charged particle extracting section corrects the trajectories of the secondary charged particles by varying the focal length of the accelerating lens.

3. A secondary charged particle analyzing apparatus comprising:
   a primary charged particle generating source;
   means for irradiating an object to be examined with primary charged particles emitted by said primary charged particle generating source;
   a secondary charged particle extracting section which controls a dispersion in an angle at which secondary charged particles emitted from substantially the same point on said object to be examined are incident to a focusing lens which focuses said secondary charged particles on an exit aperture of said secondary charged particle extracting section; and means for analyzing said secondary charged particles thus focused.

4. A secondary charged particle analyzing apparatus according to claim 3, wherein the secondary charged particle extracting section controls the dispersion in the angle at which the secondary charged particles are incident to the focusing lens by varying the focal length of an accelerating lens formed within the secondary charged particle extracting section.

5. A secondary charged particle analyzing apparatus comprising:
a primary charged particle generating source;
means for irradiating an object to be examined with primary charged particles emitted by said primary charged particle generating source;
a secondary charged particle extracting section which controls secondary charged particles emitted from substantially the same point on said object to be examined so that they are injected substantially parallel to each other in a focusing lens which focuses said secondary charged particles on an exit aperture; and
means for analyzing said secondary charged particles thus focused.

6. A secondary charged particle analyzing apparatus according to claim 5, wherein the secondary charged particle extracting section controls the secondary charged particles so that they are injected substantially parallel to each other in the focusing lens by varying the focal length of an accelerating lens formed within the secondary charged particle extracting section.

7. A secondary charged particle analyzing apparatus comprising:
a primary charged particle generating source;
means for irradiating an object to be examined with primary charged particles emitted by said primary charged particle generating source;
a secondary charged particle extracting section which does not focus secondary charged particles emitted from said object to be examined within said secondary charged particle extracting section, but which focuses said secondary charged particles emitted from said object to be examined on an exit aperture for said secondary charged particle extracting section; and
means for analyzing said secondary charged particles thus focused.

8. A secondary charged particle analyzing apparatus according to claim 7, wherein the secondary charged particle extracting section focuses the secondary charged particles on the exit aperture by varying the focal length of an accelerating lens formed within the secondary charged particle extracting section.

9. A secondary charged particle analyzing apparatus comprising:
a primary charged particle generating source;
means for irradiating an object to be examined with primary charged particles emitted by said primary charged particle generating source;
a secondary charged particle extracting section including an extracting electrode for extracting secondary charged particles emitted from said object to be examined, a focusing lens comprising a plurality of electrodes which focuses secondary charged particles thus extracted, means for applying a variable voltage to one of the plurality of electrodes of said focusing lens which is closest to said extracting electrode, and means for applying a non-variable voltage to one of the plurality of electrodes of said focusing lens which is closest to an exit aperture for said secondary charged particle extracting section; and
means for analyzing said secondary charged particles focused by said secondary charged particle extracting section.

10. A secondary charged particle analyzing apparatus comprising:
a primary charged particle generating source;
means for irradiating an object to be examined with primary charged particles emitted by said primary charged particle generating source;
a secondary charged particle extracting section including an extracting electrode for extracting secondary charged particles emitted from said object to be examined, a focusing lens comprising a plurality of electrodes, means for varying a potential difference between said extracting electrode and one of the plurality of electrodes of said focusing lens which is closest to said extracting electrode, and means for applying a non-variable voltage to one of the plurality of electrodes of said focusing lens which is closest to an exit aperture for said secondary charged particle extracting section; and
means for analyzing said secondary charged particles thus focused.

11. A secondary charged particle analyzing apparatus comprising:
a primary charged particle generating source;
means for irradiating an object to be examined with primary charged particles emitted by said primary charged particle generating source;
a secondary charged particle extracting section including an extracting electrode for extracting secondary charged particles emitted from said object to be examined, an electromagnetic lens having a variable focal length disposed directly after said extracting electrode, and a focusing lens which focuses said secondary charged particles thus extracted; and
means for analyzing said secondary charged particles thus focused.

12. A secondary charged particle extracting section, comprising means for correcting trajectories of secondary charged particles emitted from an object to be examined by means of an accelerating lens formed in the secondary charged particle extracting section, and means for focusing said secondary charged particles.

13. A secondary charged particle extracting section according to claim 12, wherein the means for correcting trajectories of the secondary charged particles includes means for varying the focal length of the accelerating lens.

14. A secondary charged particle extracting section which does not focus secondary charged particles emitted from an object to be examined within said secondary charged particle extracting section, but which focuses said secondary charged particles emitted from said object to be examined on an exit aperture for said secondary charged particle extracting section.

15. A secondary charged particle extracting section according to claim 14, wherein the secondary charged particle extracting section focuses the secondary charged particles on the exit aperture by varying the focal length of an accelerating lens formed within the secondary charged particle extracting section.

16. A secondary charged particle analyzing apparatus comprising:

a primary charged particle generating source;

means for irradiating an object to be examined with primary charged particles emitted by said primary charged particle generating source;

a secondary charged particle extracting section including means for focusing secondary charged particles emitted from said object to be examined onto an exit aperture of said secondary charged particle extracting section, and means for injecting secondary charged particles emitted from said object into said focusing means such that the focused secondary charged particles are incident on said exit aperture substantially perpendicularly thereto; and means for analyzing the focused secondary charged particles.

17. A secondary charged particle analyzing apparatus according to claim 16, wherein said injecting means includes means for varying the focal length of an accelerating lens formed within the secondary charged particle extracting section.

18. A secondary ion mass analyzing apparatus comprising a secondary charged particle analyzing apparatus according to any one of claims 1, 3, 5, 7, 9-11, or 16, wherein said primary charged particle generating source is a primary ion source, said primary charged particles are primary ions, said secondary charged particles are secondary ions, and said analyzing means is mass analyzing means; and further comprising a slit disposed at a position where said secondary ions are focused for enabling said focused secondary ions to emerge from said secondary charged particle extracting section.

19. A scanning type electron microscope comprising a secondary charged particle analyzing apparatus according to any one of claims 1, 3, 5, 7, or 9-11, or 16, wherein said primary charged particle generating source is a primary electron source, said primary charged particles are primary electrons, and said secondary charged particles are secondary electrons; and further comprising means for scanning said object to be examined with said primary electrons, and a detector disposed at a position where said secondary electrons are focused; wherein said analyzing means is a monitor for displaying an image of said object to be examined in synchronism with said scanning means on the basis of an output of said detector.

20. A secondary charged particle analyzing apparatus according to any one of claims 1, 3, 5, 7, 9-11, 12 14, or 16, wherein said secondary charged particle extracting section includes means for varying a magnification of an image formed by the focused secondary charged particles.

* * * * *